United States Patent
Derflinger et al.

(10) Patent No.: US 6,723,391 B2
(45) Date of Patent: Apr. 20, 2004

(54) METHOD FOR PRODUCING CUTTING TOOLS

(75) Inventors: Volker Derflinger, Feldkirch (AT); Harald Zimmermann, Feldkirch-Levis (AT)

(73) Assignee: Unaxis Balzers AG, Balzers (LI)

( * ) Notice: Subject to any disclaimer, the term of this patent is extended or adjusted under 35 U.S.C. 154(b) by 0 days.

(21) Appl. No.: 09/827,462

(22) Filed: Apr. 6, 2001

(65) Prior Publication Data

US 2003/0031805 A1 Feb. 13, 2003

Related U.S. Application Data

(62) Division of application No. 09/253,212, filed on Feb. 19, 1999, now Pat. No. 6,241,431.

(30) Foreign Application Priority Data

Feb. 17, 1998 (EP) .............................................. 99103093

(51) Int. Cl.⁷ .......................... C23C 16/32; C23C 16/34; C23C 16/36; H05H 1/48

(52) U.S. Cl. ........................ 427/576; 427/577; 427/580; 427/249.17; 427/249.18; 427/249.19; 427/255.32; 427/284; 427/255.394; 407/32; 407/119; 408/144

(58) Field of Search ................................. 427/569, 576, 427/577, 580, 249.17, 249.18, 249.19, 255.32, 255.394, 256, 284, 245.1; 407/32, 118, 119; 408/144, 145; 51/307, 309; 428/698

(56) References Cited

U.S. PATENT DOCUMENTS

| | | | | |
|---|---|---|---|---|
| 4,426,267 A | * | 1/1984 | Munz et al. | 204/192 R |
| 4,983,079 A | * | 1/1991 | Imanaga et al. | 408/230 |
| 5,125,775 A | * | 6/1992 | Breuer et al. | 409/132 |
| 5,272,014 A | * | 12/1993 | Leyendecker et al. | 428/457 |
| 5,330,853 A | * | 7/1994 | Hofmann et al. | 428/697 |

* cited by examiner

*Primary Examiner*—Shrive P. Beck
*Assistant Examiner*—Wesley D. Markham
(74) *Attorney, Agent, or Firm*—Notaro & Michalos P.C.

(57) ABSTRACT

Method for producing cutting tools provides a first hard material coating on a first region of a tool base body containing at least one cutting edge, using a plasma vacuum coating process. A second hard material coating is provided on a second region which is adjacent the first, also via plasma vacuum coating process. Hard material for the coatings is a carbide, oxide, oxicarbide, nitride, nitrocarbide, oxinitride or nitrooxicarbide of at least two of Ti, Zr, Hf, V, Nb, Ta, Cr, Mo, W, Al. The first coating has a content of at least two of the metal elements which is at most 2 at % different from the content of the two metal elements in the second coating if the tool is for higher adhesive strength than hardness. The first coating has a content of the two metal elements that is different from the content of the two metal elements of the second coating by more than 2 at % if the tool is for higher hardness than high adhesive strength.

15 Claims, 3 Drawing Sheets

METHOD FOR PRODUCING CUTTING TOOLS

CROSS-REFERENCE TO RELATED APPLICATION

This is a divisional of application Ser. No. 09/253,212 filed Feb. 19, 1999 and now U.S. Pat. No. 6,241,431, which claimed priority from European Patent application number 99 103093.3 file Feb. 17, 1999.

FIELD AND BACKGROUND OF THE INVENTION

Definitions

In the present specification hard material means a compound, namely a carbide, oxide, oxycarbide, but in particular a nitride, nitrocarbide, oxynitride or nitrooxycarbide, of at least two of the metallic elements listed in the following, in particular of Ti and Al. Metallic elements means Ti, Zr, Hf, V, Nb, Ta, Cr, Mo, W and Al.

If within the scope of the present application reference is made to a change of the composition of the hard material layer material in the active edge region, this means a difference of at least 2 at % of a hard material layer metal component between a hard material layer in the active edge region and a hard material layer in the remaining regions of the tool.

Analogously, no change exists if the stated difference is less than 2 at %, in particular less than 1 at %.

Machining cross section f $a_r$ means the product "Vorschub×schnitttiefe" {Advance×cutting depth} according to DIN 6580, section 11.1.1, "Bewegungen und Geometrie des Zerspanungsvorgang" [Motions and Geometry of the Machining Process] (DN 6580, October 1985).

German Patent DE 38 25 399 as well as European Patent EP 0 352 545 disclose coating tools by means of a vacuum process with a layer of hard material, and therein especially with a (Ti,Al)N hard material layer. The coating takes place such that in the active edge region, i.e. in the region of the cutting edges, the hard material layer material has a changed composition compared with that on the remaining tool regions: according to DE 38 25 399 as well as EP 0 352 545 at the active edge regions of drills a thinning out of the aluminum is realized which is distinguishable on the tools by the reddish or yellowish coloration of these regions. Thinning-out ratios of 5 at % or 2 percent by mass of the Al are declared.

SUMMARY OF THE INVENTION

The process discovered, namely to change the hard material layer composition in the active edge region, is fundamentally represented as a measure for attaining a significant improvement of the quality of the coating.

The invention starts from the understanding that generally, tools have a hard material layer in their active edge region which is substantially, and within the scope of measurability, an unchanged material composition. In contrast, the composition of the hard material layer in the active edge region is changed relative to the hard material layer composition on the remaining tool regions according to the present invention. The invention proposes a process for the protective coating of machining tools as well as a set of at least two tools, by means of which substantially improved specific working properties are attained. In particular, working properties such as the service life of the tool or decrease of the tool wear, are improved.

According to the process of the invention, a hard material layer is applied onto the basic tool body but is selected for the specific stress the tool is meant to endure. The composition of the hard material layer in the active edge region is either left with minimum changes relative to the composition of the hard material layer in the remaining coating regions on the tool basic body or is intentionally changed. The former, i.e. constant composition, is realized if the primary requirements to be made of the tools relate to adhesive strength of the hard material layer and only secondarily to hardness of the hard material layer. The second, in contrast, is realized if the primary requirements to be made of the tools relate to hardness of the hard material layer and only secondarily to adhesive strength of the hard material layer.

According to the invention it was found that by changing or not changing the compositions of the hard material layers in the active edge regions as a function of the working purpose of the tools, that is, by either providing a hard material coating of constant composition or a hard material coating of varying composition in the active edge region, critical improvements were realized. If tools for given applications, are coated with the wrong coating technique of the two mentioned, often an impairment of the tools' working properties, in particular tool life, results.

It could be shown, for example, that according to EP 0 352 545 with a thinning-out of the coating only in a few fields of machining, better or at least equally good results can be achieved, compared to the application of corresponding toots with a lower or no, at least not measurable, difference in the concentration of the hard material layer. It should be pointed out, in particular, that the example mentioned in EP 0 352 545 with respect to service life of twist drills, based on the representative comparisons made according to the present invention, is erroneous in the case where two completely identical, except for stated coating difference, and identically coated drills are present. The phrase completely identical here means an application of the same coating processes, in particular arc or sputtering processes, on identical tool bodies, and the adjustment of the realized or not realized concentration difference exclusively by adjusting the voltage applied on the basic tool body during the coating with respect to ground or reference potential, referred to as bias voltage $U_{bias}$ in the following, and/or of the reactive gas partial pressure $p_{reactiv}$ in the vacuum coating receptacle with further process parameters remaining unchanged.

It can be seen that the prior known thinning-out in the active edge region can effect critical disadvantages in the use of the tool, and that consequently it is necessary to assess very carefully according to the invention, which process is applied at which time, for example, by the fact that precisely the aluminum depletion of the hard material layer in the active edge region has negative effects on wear through thermal stress of the hard material layer since through the aluminum thinning-out potentially, now less aluminum reaches the surface of the hard material layer through diffusion and no continuous thermally insulating aluminum oxide layer can be formed there. The $Al_2O_3$ layer on the surface is simultaneously worn out during the working process and formed again through Al diffusion. But precisely this phenomenon can critically influence the durability of the hard material layer with aluminum component under specific conditions.

According to the invention as explained in the following examples, it could be shown that tools with a hard material layer, in particular a (Ti,Al)N layer, comprising only a low or no longer measurable composition change of the material of the hard material layer in the active edge region, in many applications yield a substantially better service life, even with increased cutting efficiency, than other tools that are otherwise identical, with a composition change of the hard material layer in the active edge region. Especially good results can be achieved, in the case given first, if, in the active edge region, the change of one of the metal components of the hard material layer is less than 2 at %, preferably it is maximally 1 at % or no longer measurable.

Following another feature of the invention, when using arc vaporization for depositing the hard material layer, an as much as possible unchanged hard material layer composition in the active edge region is attained when the ratio $U_{BIAS}$—of the electric basic tool body voltage relative to reference potential, usually ground potential—to the partial pressure of the reactive gas $p_{reactiv}$, has the following range of values:

$$1 \times 10^{-3} \leq U_{BIAS}/P_{reactiv} \leq 4 \times 10^3,$$

with the unit of voltage being "volt" and the unit of pressure "mbar".

Furthermore the invention produces drills, roughing milling cutters, peripheral milling cutters and hobbing machines with as much as possible unchanged composition of the hard material layer in the active edge region, and front-end milling cutters and ball-end milling cutters with changed composition of the hard material layer in the active edge region.

It was in particular found that the composition of the hard material layer in the active edge region of the tools should be unchanged, as far as possible, if these tools are intended for the working of relatively large voltage or cross sections and for low cutting rates; however, tools should be prepared with a changed composition of the hard material layer in the active edge region if the tools are intended for relatively low voltage machining cross sections but relatively high cutting rates.

A further criterion for making the selection according to the invention, of the type of hard material coating in the active edge region of the tools, is for the working of materials with a hardness of at most 45 Rockwell (HRS) and a tensile strength up to at most 1500 N/mm², preferred for the working of heat-treatable steels, high-alloy and stainless steels as well as of nonferrous metals, to carry out the coating with hard material in the active edge region as much as possible without changing the composition. The same applies to tools whose active edges in use are simultaneously subjected to different cutting rates, such as in particular, drills on which a minimum cutting rate occurs at the tip of the drill and a high rate on the drill periphery.

Basic tool bodies are coated in the active edge region with changed composition of the hard material layer, which are intended for the machining working of materials with a hardness of more than 45 Rockwell (HRC) and with a tensile strength of more than 1500 N/mm², in particular for operations involving the removal of hard metal by cutting tools, for example, instead of grinding or erosion processes.

In the following AISI refers to known materials categorized by the American Iron and Steel Institute and DIN refers to materials categorized by the Deutsches Institute für Normung (German Standards Institute). Other know standards are also used to identify other material types.

It has in particular been found, that indexable inserts for turning tools and for materials AISI 304SS or DIN 1.4306 to be worked, indexable inserts for peripheral milling cutters for materials AISI 4140 or DIN 1.7225 to be worked, indexable inserts SEE 42TN for milling cutters for material SKD 61 (HRC 45) to be worked, hard metal roughing shank-type milling cutters for materials DIN 1.2344 to be worked in dry working, as well as HSS drills for materials AISI D3 or DIN 1.2080 as well as GG 25 to be worked with emulsion lubrication should be realized as much as possible with unchanged composition of the hard material layer in the active edge region; however hard metal roughing shank-type milling cutters for materials DIN 1.2311 to be worked with emulsion lubrication hard metal front-end milling cutters for materials AISI D2 or DIN 1.237 to be worked hard metal ball-end milling cutters J97 for dry working of DIN 1.2343, 49.5 HRC, preferably with changed composition of the hard material layer in the active edge region.

Further, at least two tools are therein provided, one for a first specific application operation in which primarily high adhesion strength of the hard material layer is required, however, only secondarily high hardness of the hard material layer, and a second tool, during the application of which primarily high hardness of the hard material layer is required and only secondarily high adhesion strength of this layer.

In this tool set according to the invention, the first tool is coated in the active edge region with substantially uniform composition of the hard material layer, however the second one with varying composition of the hard material layer.

Whether or not a tool is provided with a hard material coating whose composition in the active edge region is changed, is often evident by the coating coloration of the tool in the active edge region, thus typically for (Ti,Al)N layers with Al depletion in the active edge region through its yellowish or reddish coloration in stated region.

Through the present specification and the claims, the relevant expert gains clear instructions, based on which criteria he is to investigate, which active edge hard material coating techniques lead to better tool application behavior. Even when in specification and claims specific tool types as well as their type of application and the materials to be worked are specified, this is not to be understood to be conclusive for the expert but rather he recognizes, based on the evaluation of the useful coating type for further tools for further application fields and materials, considered by analogy, which coating technique is to be applied, or he obtains the advice first of all to try which of the two coating techniques leads to better results.

BRIEF DESCRIPTION OF THE DRAWINGS

In the following the invention will be explained with reference to examples and, in connection therewith, to the drawing, wherein.

DESCRIPTION OF THE PREFERRED EMBODIMENTS

In the discussed examples, identical basic tool bodies were in each instance coated by means of arc vaporization. In examples 1 to 4 the coating conditions specified in the following by A and B were selected. The layer thickness, in particular in the active edge regions, was approximately 3.5 μm.

Figure 1:
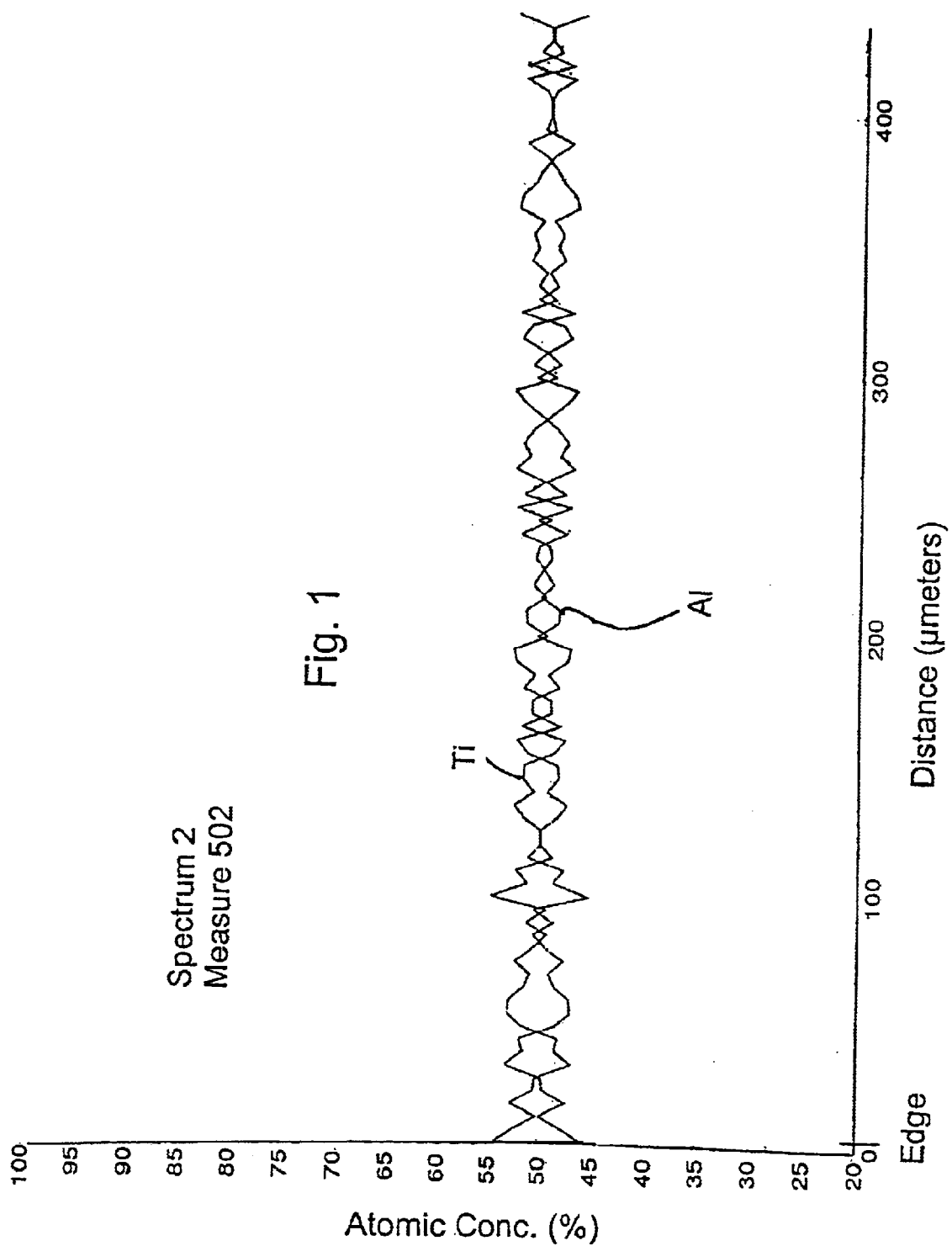
FIG. 1 is an Auger line scan diagram, recorded in the active edge region, by example of an indexable insert of type SNGA 120408, at right angles to the active edge, the titanium and aluminum distribution being recognizably uniform, corresponding to an unchanged composition of the hard material layer in the active edge region.

The coatings realized under A show a uniform titanium or aluminum distribution according to the Auger line scan of FIG. 1. It was recorded starting on the edge of an indexable insert of Type SNGA 120408 coated according to A at right angles to the active edge or the polished machining face to a length of 0.5 mm, corresponding to approximately 60 measuring points per scan. The hardness of the layers realized under A was approximately 3000 $HV_{0.06}$.

Figure 2:
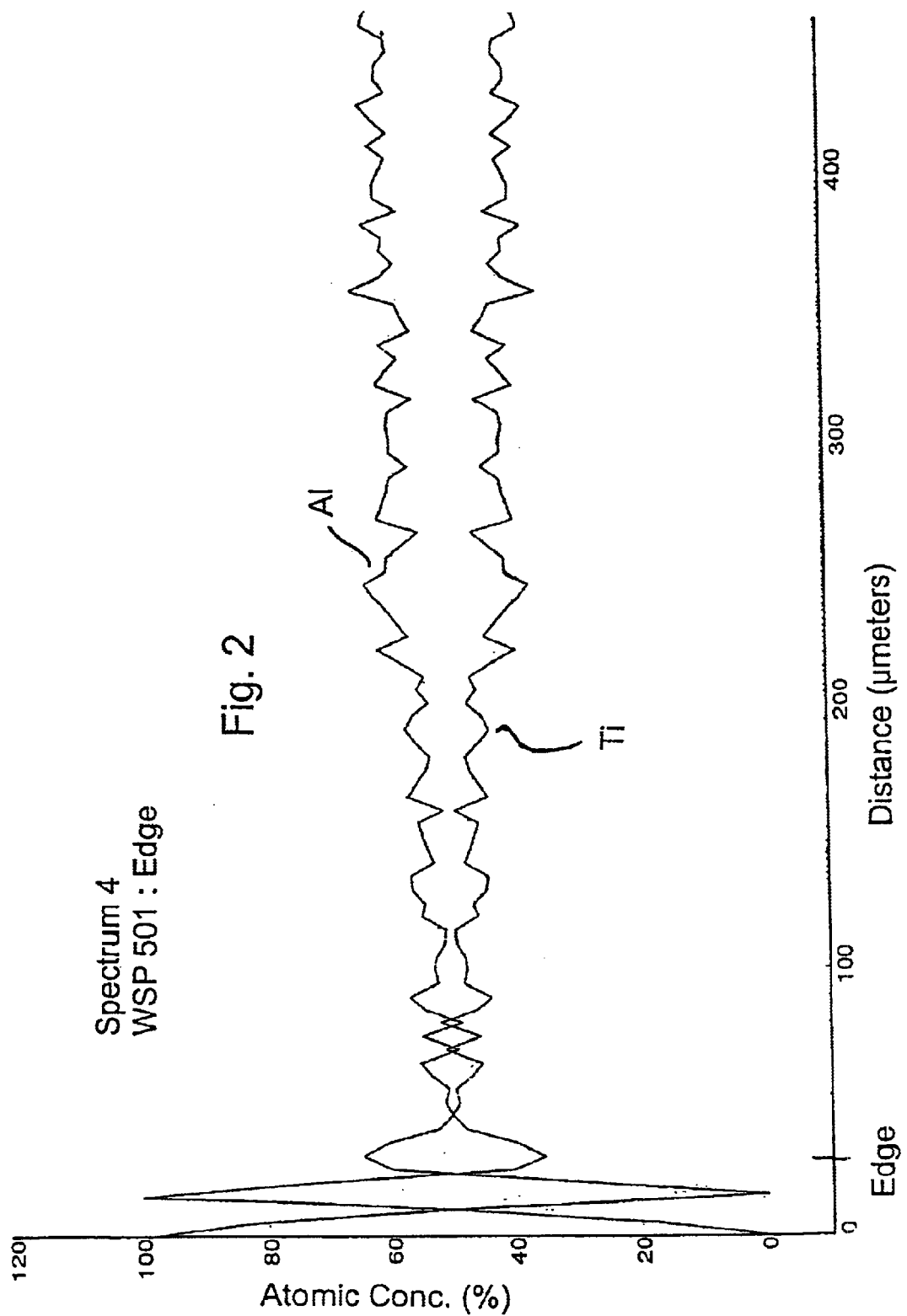
FIG. 2 is an Auger line scan diagram recorded on the same object as in FIG. 1, however, on which the titanium and aluminum distribution in the active edge region is of changed composition of the material of the hard material layer.

The parameters described under B yield layers which in the active edge region (that is on either side of the edge proper) and have a strong depletion of the aluminum, namely from 50 at % (on the edge) to 40 at %, or an enrichment of titanium from 50 at % (on the edge) to 60 at %, according to FIG. 2. With more sharply pronounced edges, such as for example in the case of knife cutters, markedly greater differences in the material composition of the hard layer could be measured. The hardness of the layers deposited under B is approximately 3500 $HV_{0.06}$. In the following tables, the two parameter sets A and B for the arc vaporization coating are summarized.

All experiments were carried out on an installation BAJ 1200 under production conditions.

Figure 3:
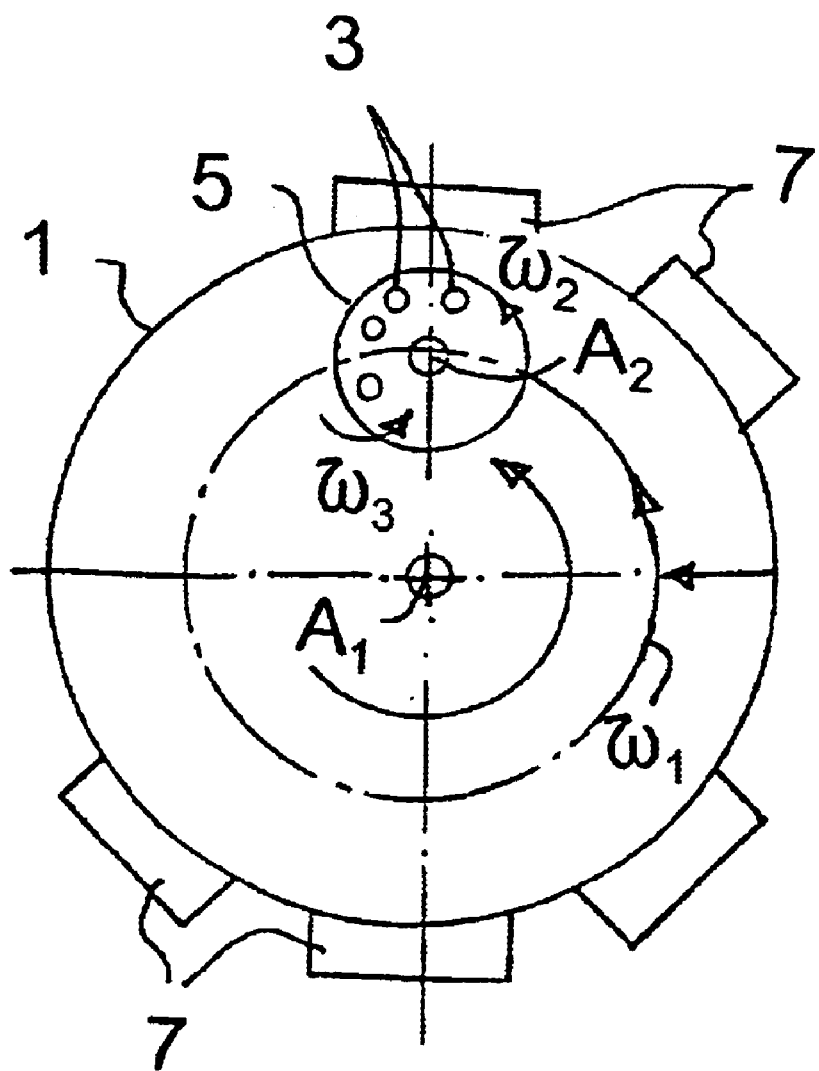
FIG. 3 is a simplified and schematically diagram of a view onto an installation used for the described experiments.

In FIG. 3 the view onto an installation of the given type is shown schematically. In a cylindrical treatment chamber 1 a revolving table is supported rotatably with respect to the central axis $A_1$ as shown with the rotational motion $\omega_1$. On the revolving table several substrate carrier arrangements 3 are supported each rotatable about axes $A_2$ as is shown with the rotational motion $\omega_2$. On the substrate carrier arrangements 3 are supported in individual substrate carriers the substrates 5 grouped about the particular axis $A_2$, which substrates are preferably themselves, and as shown with $\omega_3$ driven about their own axis, set into rotational motion.

Onto the wall of the chamber 1 are flanged one or several arc vaporizer sources 7. With respect to the specific and detailed structure of the installation used, reference is made for example to U.S. Pat. No. 5,709,784 by the same applicant.

In the experiments exclusively $N_2$ gas was used, i.e. as the working gas as well as also the reactive gas. It is understood that additionally also an inert gas, in particular argon, can be used as the working gas. For the coating of type A the total pressure, i.e. the $N_2$ pressure, was approximately $3 \times 10^{-2}$ mbars, for the experiments B approximately $1 \times 10^{-2}$ mbars.

Ti, Al was arc-vaporized from alloy targets.

In the following tables denote further:

$P_{N2}$: partial pressure of reactive gas $N_2$ $I_{Ti}$: arc current during titanium vaporization $I_{TiAl}$: arc current during TiAl alloy vaporization

| Parameter | TiN Intermediate Layer | (TiAl)N Hard Material Layer |
|---|---|---|
| Coating Parameters A: | | |
| $p_{N2}$ [mbar] | $8 \times 10^{-3}$ | $3.2 \times 10^{-2}$ |
| $I_{Ti}$ [A] | 170 | 0 |
| $I_{TiAl}$ [A] | 0 | 200 |
| $U_{BTAS}$ [V]–200 | –40 | |
| Coating Parameters B: | | |
| $p_{N2}$ [mbar] | $8 \times 10^{-3}$ | $1 \times 10^{-2}$ |
| $I_{Ti}$ [A] | 170 | 0 |
| $I_{TIAL}$ [A] | 0 | 200 |
| $U_{ATAS}$ [V] | –150 | –150 |

In all cases a TiN intermediate layer was installed between basic tool body and hard material layer.

EXAMPLE 1

| Experiment No. | Layer | Working Cycles | Cycle Average |
|---|---|---|---|
| 1 | TiN | 7.5 | 6.8 |
| 2 | | 6.5 | |
| 3 | | 6.5 | |
| 4 | TiAlN "A" | 21.0 | 18.3 |
| 5 | | 17.0 | |
| 6 | | 17.0 | |
| 7 | TiAlN "B" | 6.4 | 5.8 |
| 8 | | 5.5 | |
| 9 | | 5.5 | |

Tool: Turning tools with indexable insert K313/CNGP432
Material worked: AISI 304SS = DIN 1.4306
Cutting rate: $v_c$ = 244 m/min
Advance per rotation: $f_u$ = 0.2 mm/r
Cutting depth: $a_p$ = 1.524 mm
Lubricant: emulsion

EXAMPLE 2

| Experiment No. | Layer | Working Cycles | Cycle Average |
|---|---|---|---|
| 10 | TiN | 15.0 | 14.8 |
| 11 | | 13.0 | |
| 12 | | 15.5 | |
| 13 | | 15.5 | |
| 14 | TiAlN "A" | 37.0 | 24.8 |
| 15 | | 19.0 | |
| 16 | | 21.5 | |
| 17 | | 21.5 | |
| 18 | TiAlN "B" | 13.0 | 12 |
| 19 | | 11.0 | |
| 20 | | 12.0 | |
| 21 | | 12.0 | |

Tool: Peripheral milling cutters with indexable insert K903/SEHW43A6T
Material worked: AISI 4140 = DIN 1.7225
Cutting rate: $v_c$ = 1152 m/min
Advance per rotation: $f_t$ = 0.25 mm/r
Cutting depth: $a_p$ = 2.54 mm
Lubricant: emulsion

EXAMPLE 3

| Experiment No. | Layer | Average Number of Holes |
|---|---|---|
| 28 | TiN | 45 |
| 29 | TiCN | 85 |
| 30 | TiAlN "A" | 190 |
| 31 | TiAlN "B" | 30 |

Tool: HSS drill, 6mm  
Material worked: AISI D3 = DIN 1.2080  
Cutting rate: $v_c$ = 35 m/min  
Advance per rotation: $f_0$ = 0.12 mm/r  
Engagement size: $a_o$ = 3 mm  
Drilling depth: h = 15 mm, pocket hole  
Lubricant: 5% emulsion Example 1, 2 and 3 show that for specific tools and conditions of use a composition of the hard material changed in the active edge region, in particular depletion of Al, leads to markedly poorer service lives than an unchanged composition of the hard material layer.

EXAMPLE 4a

| Experiment No. | Layer | Wear Width in μm after x Operations | | | |
|---|---|---|---|---|---|
| | | x = 10 | x = 20 | x = 30 | x = 35 |
| 22 | TiAlN "A" | 45 | 54 | 65 | 70 |
| 23 | TiAlN "B" | 50 | 69 | 80 | 88 |

Tool: Hard metal roughing shank-type milling cutter, ⌀ = 10 mm, 25/64  
Teeth number: z = 4  
Material worked: DIN 1.2344, 55-56 HRC  
Cutting rate: $v_c$ = 50 m/min  
Advance per rotation: $f_t$ = 0.02 mm/tooth  
Engagement size: $a_e$ = 2 mm  
Cutting depth: $a_p$ = 10 mm  
Lubricant: dry, compressed-air cooling This example shows especially hard conditions of use since hard material is worked dry. The tools coated with the parameters A and consequently tools with unchanged composition of the hard material layers in the active edge region show markedly lower wear mark widths than tools with changed composition of the hard material layer in the active edge region.

EXAMPLE 4b

| Experiment No. | Layer | Average Length of Path |
|---|---|---|
| 24 | TiN | 24 |
| 25 | TiCN | 27 |
| 26 | TiAlN "A" | 42 |
| 27 | TiAlN "B" | 78 |

Tool: Hard metal roughing shank-type milling cutter, ⌀ = 10 mm, 25/64  
Teeth number: z = 3  
Machine material: DIN 1.2311, 33 HRC, Rm = 1050 N/mm²  
Cutting rate: $v_c$ = 100 m/min  
Advance per rotation: $f_t$ = 0.035 mm/tooth  
Engagement size: $a_o$ = 3 mm  
Cutting depth: $a_p$ = 16 mm  
Lubricant: 5% emulsion This example makes evident that at high cutting rate and additional emulsion lubrication, further with relatively soft material to be worked, on average greater path lengths are achieved with the coating technique according to B.

Consequently, Examples 4a and 4b show that in similar operations but different conditions of use, identical tools coated differently in the active edge region are advantageous in each instance.

In the following Examples 5 to 9 further tools are specified with the particular applicable coating parameters analogous to A and B. Those tools with constant composition of the hard material layer in the active edge region are denoted by $A_0$, analogous tools with changed composition of the hard material layer in the active edge region by $B_0$. Apart from the specified coating parameters, identical basic tool bodies were coated with identical coating processes and compared with one another with respect to their service life.

EXAMPLE 5

| Samples | No. | Coating Conditions | | | Al decrease toward edge [at %] | Cutting length (m) |
|---|---|---|---|---|---|---|
| | | Bias [-V] | N2 [10⁻² mbars] | Arc Current [A] | | |
| $A_0$ | 32 | 60 | 2.5 | 150 | 1 | 3.2 |
| | 33 | 60 | 3.2 | 150 | 1 | 3.0 |
| | 34 | 40 | 2.0 | 150 | 0 | 8.8 |
| | 35 | 40 | 4.0 | 150 | 0 | 3.9 |
| | 36 | 40 | 0.5 | 150 | 0 | 2.0 |
| | 37 | 30 | 2.0 | 150 | 0 | 4.2 |
| $B_0$ | 38 | 100 | 2.0 | 150 | 4 | 1.1 |
| | 39 | 150 | 3.0 | 150 | 7 | 1.1 |
| | 40 | 150 | 2.0 | 150 | 4 | 0.5 |

Tool: milling cutter with indexable inserts SEE 42 TN (G9)  
Teeth number: z = 6  
Layer thickness ($Ti_xAl_y$)N: each 4.5 μm  
Material worked: SKD 61 (HRC45)  
Cutting rate: $v_c$ = 100 m/min  
Advance per tooth: $f_x$ = 0.1 mm/tooth  
Cutting depth: $a_p$ = 2 mm

EXAMPLE 6

| Samples | No. | Coating Conditions | | | Al decrease toward edge [at %] | Number boreholes |
|---|---|---|---|---|---|---|
| | | Bias [-V] | N2 [10⁻² mbars] | Arc Current [A] | | |
| $A_0$ | 41 | 40 | 3.0 | 200 | 0 | 198 |
| | 42 | 40 | 3.0 | 200 | 0 | 231 |
| $B_0$ | 43 | 150 | 1.0 | 200 | 7 | 45 |
| | 44 | 150 | 1.0 | 200 | 7 | 38 |

Tool: HSS drill, ⌀ 6 mm  
Layer thickness ($Ti_xAl_y$)N: each 5 μm  
Intermediate TiN layer: each 0.5 μm  
Material worked: DIN 1.2080 (AISI D3)  
(with emulsion)  
Cutting rate: $v_c$ = 40 m/min  
Advance: f = 0.10 mm/r  
Drilling depth: 15 mm (pocket hole)

EXAMPLE 7

| Samples | No. | Coating Conditions | | | Al decrease toward edge [at %] | Cutting length [m] |
|---|---|---|---|---|---|---|
| | | Bias [−V] | N2 [$10^{-2}$ mbars] | Arc Current [A] | | |
| $A_0$ | 45 | 40 | 2.5 | 200 | 0 | 41 |
| $B_0$ | 46 | 150 | 1.0 | 200 | 7 | 12 |

Tool: HSS roughing milling cutter, ø 12 mm
Number of teeth: z = 4
Layer thickness $(Ti_xAl_y)N$: each 4.5 μm
Intermediate TiN layer: each 0.3 μm
Material worked dry: DIN 1.2344 (AISI H13)
Cutting rate: $v_c$ = 120 m/min
Advance per tooth: $f_z$ = 0.6 mm/tooth
Cutting depth: $a_p$ = 20 mm
Engagement size: $a_e$ = 5 mm

EXAMPLE 8

| Samples | No. | Coating Conditions | | | Al decrease toward edge [at %] | Number boreholes |
|---|---|---|---|---|---|---|
| | | Bias [−V] | N2 [$10^{-2}$ mbars] | Arc Current [A] | | |
| $A_0$ | 47 | 40 | 3.0 | 200 | 0 | 2840 |
| $B_0$ | 48 | 150 | 1.1 | 200 | 7 | 1270 |

Tool: Hard metal drill, ø 11.8 mm
Layer thickness $(Ti_xAl_y)N$: each 5 μm
Intermediate TiN layer: each 0.5 μm
Material worked: GG 25 (gray cast iron)
(with emulsion)
Cutting rate: $v_c$ = 110 m/min
Advance: f = 0.4 mm/tooth
Drilling depth: 35 mm (pocket hole)

EXAMPLE 9

| Samples | No. | Coating Conditions | | | Al decrease toward edge [at %] | Cutting length [m] |
|---|---|---|---|---|---|---|
| | | Bias [−V] | N2 [$10^{-2}$ mbars] | Arc Current [A] | | |
| $A_0$ | 49 | 40 | 3.0 | 200 | 0 | 4.732 |
| $B_0$ | 50 | 150 | 1.0 | 200 | 7 | 2.015 |

Tool: Hard metal indexable insert, external turning
Layer thickness $(Ti_xAl_y)N$: each 5 μm
Intermediate TiN layer: each 0.2 μm
Material worked: DIN 1.4306 (X2CrNi 1911)
(with lubrication)
Cutting rate: $v_o$ = 240 m/min
Advance per rotation: f = 0.6 mm
Cutting depth: $a_p$ = 1.5 mm The Examples 5 to 9 show the superiority of tools with unchanged hard material layer composition in the active edge region in different spectific applications.

EXAMPLE 10

| Samples | No. | Coating Conditions | | | Al decrease toward edge [at %] | Cutting length [m] |
|---|---|---|---|---|---|---|
| | | Bias [−V] | N2 [$10^{-2}$ mbars] | Arc Current [A] | | |
| $A_0$ | 51 | 40 | 3.0 | 200 | 0 | 4 |
| | 52 | 40 | 2.0 | 200 | 0 | 2 |
| | 53 | 20 | 2.0 | 200 | 0 | 3 |
| | 54 | 70 | 3.0 | 200 | 1.5 | 12 |
| $B_0$ | 55 | 200 | 3.0 | 200 | 9 | 21 |
| | 56 | 150 | 2.0 | 200 | 7 | 29 |
| | 57 | 100 | 1.0 | 200 | 4 | 17 |
| | 58 | 100 | 2.0 | 200 | 4 | 22 |

Tool: Hard metal front-end milling cutter, ø 10 mm
Tooth number: z = 6
Layer thickness $(Ti_xAl_y)N$: each 3.5 μm
Material worked dry AISI (DIN 1.2397), 60 HRC
Cutting rate: $v_c$ = 20 m/min
Advance per tooth: $f_x$ = 0.035 mm/tooth
Cutting depth: $a_p$ = 15 mm
Engagement size: $a_o$ = 1 mm

EXAMPLE 11

| Samples | No. | Coating Conditions | | | Al decrease toward edge [at %] | Cutting length [m] |
|---|---|---|---|---|---|---|
| | | Bias [−V] | N2 [$10^{-2}$ mbars] | Arc Current [A] | | |
| $A_0$ | 55 | 40 | 3.5 | 200 | 0 | 22 |
| $B_0$ | 56 | 150 | 1.0 | 200 | 7 | 31 |

Tool: Hard metal front-end milling cutter, ø 10 mm
Tooth number: z = 6
Layer thickness $(Ti_xAl_y)N$: each 3.5 μm
Intermediate TiN layer: each 0.1 μm
Material worked: DIN 1.2379 (AISI D2), 60 HRC
Cutting rate: $v_c$ = 20 m/min
Advance per tooth: $f_x$ = 0.03 mm/tooth
Cutting depth: $a_p$ = 15 mm
Engagement size: $a_e$ = 1 mm

EXAMPLE 12

| Samples | No. | Coating Conditions | | | Al decrease toward edge [at %] | Cutting length [m] |
|---|---|---|---|---|---|---|
| | | Bias [−V] | N2 [$10^{-2}$ mbars] | Arc Current [A] | | |
| $A_0$ | 57 | 40 | 3.0 | 200 | 0 | 111 |
| $B_0$ | 58 | 150 | 1.0 | 200 | 7 | 168 |

Tool: Hard metal ball-end milling cutter 097 (Jabro), R4 (ø 8 × 65 mm
Layer thickness $(Ti_xAl_y)N$: each 3.5 μm
Intermediate TiN layer: each 0.1 μm
Material worked dry: DIN 1.2343, 49.5 HRC
Cutting rate: $v_c$ = 240 m/min
Cutting depth: $a_p$ = 0.5 mm Examples 10 to 12 Show that under certain application conditions and with specific tools the service lives are increased if the composition of the hard metal layer is changed in the active edge region.

What is claimed is:

1. A method of manufacturing tools comprising: a first cutting tool for working a metal and being a tool selected from a first group of tools consisting of drills, roughing milling cutters, peripheral milling cutters, tools for hobbing machines, turning tools; and a second cutting tool for working a metal and being a tool selected from a second group of tools consisting of front-end milling cutters and ball-end milling cutters; the method further comprising:

providing on a first region of a tool body of said first and of said second cutting tools, which first region contains at least one cutting edge, a first hard material coating by means of a plasma vacuum coating process;

providing on a second region of the tool body of said first and of said second cutting tools, which second region is adjacent said first region, a second hard material coating by means of said plasma vacuum coating process;

selecting as hard material for said first and for said second hard material coatings of said first and of said second cutting tools, a material selected from the group consisting of: carbide, oxide, oxicarbide, nitride, nitrocarbide, oxinitride and nitro oxicarbide of at least two of the metal elements Ti, Zr, Hf, V, Nb, Ta, Cr, Mo, W and Al; and selecting said first hard material coating for said first cutting tool to have a content of said at least two metal elements which is at most 2 at % different from a content of said at least two metal elements in said second hard material coating, and selecting said first hard material coating for said second cutting tool to have a content of said at least two metal elements to be different from the content of said at least two metal elements of said second hard material coating by more than 2 at %.

2. The method of claim 1, further comprising the step of depositing at least as a part of, said hard material coatings a (Ti,Al)N coating on said tool body of said first and of said second cutting tools.

3. The method of claim 2, further comprising the step of providing an intermediate layer between said tool body and said hard material coatings of said first and of said second cutting tools.

4. The method of claim 1, further comprising the step of depositing said hard material coatings by means of arc evaporation.

5. The method of claim 1, further comprising the step of forming said first hard material coating to have a content of said at least two metal elements that is different from said content of said at least two metal elements in said second hard material coating by at most 2at % by establishing a ratio of a bias voltage applied to said tool body of said first cutting tool during said coating process with respect to an electric reference potential for a plasma discharge of said plasma vacuum coating process with respect to partial pressure of a reactive gas in a process atmosphere of said plasma vacuum coating process to be:

$$1\times10^3 \leq U_{bias}/P_{reactive} \leq 4\times10^3$$

wherein $U_{bias}$ stands for said bias voltage in volts and $P_{reactive}$ stands for said partial pressure in mbar.

6. The method of claim 5, including selecting ground potential as said electric reference potential.

7. The method of claim 1, further comprising the step of applying said first hard material coating with a content of said at least two metal elements to be different by at most 2 at % with respect to said content of said at least two metal elements of said second hard material coating for said tool body of the first cutting tool for cutting with a relatively larger cross-sectional area of cut at a relatively lower cutting rate; and applying said first hard material coating with a content of said at least two metal elements to be different by more than 2 at % with respect to the content of said at least two metal elements in said second hard material coating for said tool body of the second cutting tool for cutting with a relatively smaller cross-sectional area of cut at a relatively faster cutting rate as compared to the area and rate for said tool body of the first cutting tool.

8. The method of claim 1, wherein the tool body for the first cutting tool is for working quenched steels, highly alloyed steels, stainless steels or non-ferrous metals.

9. The method of claim 1, further comprising the step of applying said first hard material coating to have a content of said at least two metal elements to be different from said content of said at least two metal elements in said second hard material coating by at most 2 at % for said tool body of the first cutting tool having the cutting edge being loaded simultaneously with different cutting speeds relative to a worked workpiece.

10. The method of claim 9, wherein the first cutting tool is a drill where minimum cutting speed occurs at a tip of the drill and higher cutting speed occurs at a circumference of the drill.

11. The method of claim 1, wherein the tool body of the second cutting tool is for a tool for hard chipping.

12. The method of claim 1, wherein said first and second hard material coatings comprise at least one (Ti,Al)N layer.

13. The method of claim 1, including selecting said first hard material coating to have a content of said at least two metal elements which is at most 1 at % different from the content of said at least two metal elements in said second hard material coating for the first cutting tool for relatively higher adhesive strength of the first hard material coating and relatively lower hardness of said first hard material as compared with adhesive strength and hardness of the first hard material coating of the second cutting tool.

14. The method of claim 13, wherein a content of Al in the material composition of said first hard material coating varies by less than 1 at % with respect to the content of said Al in said second hard material coating for the first cutting tool for relatively higher adhesive strength of the first hard material coating and relatively lower hardness of said first hard material coating, and further selecting the content of Al in the material composition of said first hard material coating to be different from the content of said Al of said second hard material coating by more than 2 at % for the second cutting tool for relatively higher hardness of said first hard material coating and relatively lower adhesive strength of said first hard material coating as compared to the adhesive strength and hardness for first hard material coating of the first cutting tool.

15. The method of claim 1, wherein the metal to be cut with the first cutting tool has a hardness of at most 45 Rockwell (HRC) and a tensile strength of up to at most 1500 N/mm$^2$ and the metal to be cut with the second cutting tool has a hardness of more than 45 Rockwell (HRC) and a tensile strength of more than 1500 N/mm$^2$.

* * * * *